United States Patent
Zambetti (10) Patent No.: US 11,223,279 B2
(45) Date of Patent: Jan. 11, 2022

(54) RESONANT SWITCHED TRANSFORMER CONVERTER

(71) Applicant: STMicroelectronics S.r.l., Agrate Brianza (IT)

(72) Inventor: Osvaldo Enrico Zambetti, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 58 days.

(21) Appl. No.: 16/867,259

(22) Filed: May 5, 2020

(65) Prior Publication Data

US 2020/0358355 A1    Nov. 12, 2020

(30) Foreign Application Priority Data

May 10, 2019    (IT) ........................ 102019000006719

(51) Int. Cl.
*H02M 3/158* (2006.01)
*H02M 7/219* (2006.01)
(Continued)

(52) U.S. Cl.
CPC .......... *H02M 3/158* (2013.01); *H02M 7/219* (2013.01); *H03K 17/693* (2013.01); *H02M 1/0054* (2021.05); *H02M 7/4815* (2021.05)

(58) Field of Classification Search
CPC .. H02M 1/0054; H02M 1/0058; H02M 3/158; H02M 3/33538; H02M 3/33546;
(Continued)

(56) References Cited

U.S. PATENT DOCUMENTS

| | | | |
|---|---|---|---|
| 8,169,797 B2* | 5/2012 | Coccia ................ | H02M 1/4225 363/21.03 |
| 9,019,725 B2* | 4/2015 | Cantoro .............. | H02M 3/3387 363/21.03 |

(Continued)

FOREIGN PATENT DOCUMENTS

| | | | |
|---|---|---|---|
| EP | 2709257 A2 | 3/2014 | |
| JP | 2018156773 | * 10/2018 | ............... H05G 1/20 |
| WO | 2008032362 A1 | 3/2008 | |

OTHER PUBLICATIONS

Zhang, J., et al., "A Modified DC Power Electronic Transformer Based on Series Connection of Full-Bridge Converters," IEEE Transactions on Power Electronics, Mar. 2019, p. 1-15, vol. 34 No. 3.

*Primary Examiner* — Matthew V Nguyen
(74) *Attorney, Agent, or Firm* — Slater Matsil, LLP (57) ABSTRACT

An electronic converter comprises first and second electronic switches that are connected between positive input and output terminals, where an intermediate node between the first and second electronic switches represents a first switching node. Third and fourth electronic switches are connected between the positive output terminal and a negative input terminal, where an intermediate node between the third and fourth electronic switches represents a second switching node. A first terminal of a primary winding of a transformer is connected to the second switching node, and a capacitor and inductance are connected in series between a second terminal of the primary winding and the first switching node. Fifth and sixth electronic switches are connected between the positive output terminal and a negative output terminal, where a first terminal of the secondary winding is connected to an intermediate node between the fifth and sixth electronic switches.

22 Claims, 5 Drawing Sheets

(51) Int. Cl.
*H03K 17/693* (2006.01)
*H02M 1/00* (2006.01)
*H02M 7/48* (2007.01)

(58) Field of Classification Search
CPC ............ H02M 3/33569; H02M 3/337; H02M 3/3376; H02M 7/219; H02M 7/4815; H03K 17/693; Y20B 70/10
See application file for complete search history.

(56) References Cited

U.S. PATENT DOCUMENTS

| | | | |
|---|---|---|---|
| 9,479,073 B2* | 10/2016 | Chen | H02M 3/33546 |
| 9,917,517 B1 | 3/2018 | Jiang et al. | |
| 2014/0198536 A1* | 7/2014 | Fu | H02M 3/33576 |
| | | | 363/17 |
| 2015/0214844 A1* | 7/2015 | Kyono | H02M 3/33569 |
| | | | 363/21.02 |
| 2019/0393769 A1* | 12/2019 | Wei | H02M 3/33523 |

* cited by examiner

RESONANT SWITCHED TRANSFORMER CONVERTER

CROSS-REFERENCE TO RELATED APPLICATIONS

This application claims the benefit of Italian Application No. IT 102019000006719, filed on May 10, 2019, which application is hereby incorporated herein by reference.

TECHNICAL FIELD

The embodiments of the present disclosure refer to electronic converters.

BACKGROUND

Power-supply circuits, such as AC/DC or DC/DC switching power supplies, are well known in the art. There exist many types of electronic converters, which are principally divided into isolated and non-isolated converters. For instance, non-isolated electronic converters are the converters of the "buck", "boost", "buck-boost", "Ćuk", "SEPIC", and "ZETA" type. Instead, isolated converters are, for instance, converters of the "flyback", "forward", "half-bridge", and "full-bridge" type. Such types of converters are well known to the person skilled in the art.

Figure 1:
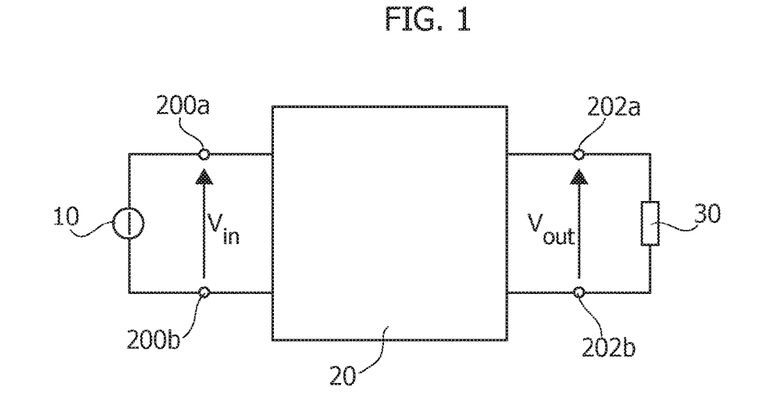
FIG. 1 shows an electronic converter.

FIG. 1 is a schematic illustration of a DC/DC electronic converter 20. In particular, a generic electronic converter 20 comprises two input terminals 200a and 200b for receiving a DC voltage $V_{in}$ and two output terminals 12a and 12b for supplying a DC voltage $V_{OUT}$. For example, the input voltage $V_{in}$ may be supplied by a DC current generator 10, such as a battery, or may be obtained from an AC voltage by means of a rectifier circuit, such as a diode bridge, and possibly a filtering circuit. Instead, the output voltage $V_{out}$ may be used for supplying a load 30.

In general, as is well known, an electronic switching converter 20 comprises one or more reactive elements, such as capacitances and/or inductances, and one or more electronic switches that manage transfer of energy from the input 200a/200b to the reactive element or elements and/or from the reactive element or elements to the output 202a/202b.

Power distribution is continuously evolving from various points of view, such as power density, efficiency, and cost of the solution.

For instance, it is desirable to find converter solutions that are more efficient and at the same time compact and easy to use for the applications in which a scaling of the input voltage $V_{in}$ by a factor $N_{CONV}$ is required, i.e., $V_{OUT}=V_{in}/N_{CONV}$. For instance, such voltage converters of a step-down type are widely used in the field of power management, for example in the context of computers, such as servers.

For instance, to meet the increasingly stringent requisites of power density it is necessary to reduce the size of the magnetic components (inductances, such as inductors or transformers) and, to do this, it is necessary to increase the operating frequency of the system. However, as is well known, as the operating frequency increases, also the switching losses increase in a linear way. Hence, as the switching frequency of the system increases, it is necessary to minimise the switching losses, for instance, by increasing the speed of the switches, such as the FETs (Field-Effect Transistors), for example, MOSFETs (Metal-Oxide-Semiconductor Field-Effect Transistors). To meet these increasingly stringent requirements for high efficiency, there have thus been developed switching elements with increasing performance, for example in terms of switching speed and figure of merit (resistance Rdson of the MOSFETs in the closed condition multiplied by the charge Qg required until the MOSFET closes).

The demand for switches/MOSFETs with higher switching speed hence makes it possible to increase the switching frequency in order to reduce the magnetic components (inductances) and thus increase the power density of the conversion systems. However, the use of faster transistors calls for the development of more costly technologies with a major impact on the cost of the final solution of the converter.

Another way to minimise the switching losses is to get the switches/MOSFETs to function in ZVS (Zero-Voltage Switching) or ZCS (Zero-Current Switching) conditions, or else to get the switches to function with lower voltages, for example the MOSFETs to function with lower drain-to-source voltages $V_{DS}$. For instance, solutions have been developed for getting the FETs to work with a fraction of input voltage $V_{in}$. In this context, the document U.S. Pat. No. 9,916,517 may, for example, be cited.

SUMMARY

Considering the foregoing, an object of various embodiments of the present description is to provide more efficient electronic converters.

According to one or more embodiments, the above object is achieved by means of an electronic converter having the distinctive elements set forth specifically in the ensuing claims.

The claims form an integral part of the technical teaching of the description provided herein.

As mentioned previously, various embodiments regard an electronic converter. In various embodiments, the electronic converter comprises a positive input terminal and a negative input terminal for receiving an input voltage, and a positive output terminal and a negative output terminal for supplying an output voltage, where the negative output terminal is connected to the negative input terminal.

In various embodiments, a first electronic switch and a second electronic switch are connected between the positive input terminal and the positive output terminal, where the intermediate node between the first and second electronic switches represents a first switching node.

In various embodiments, a third electronic switch and a fourth electronic switch are connected between the positive output terminal and the negative input terminal, where the intermediate node between the third and fourth electronic switches represents a second switching node.

In various embodiments, the electronic converter comprises a transformer, which includes a primary winding and a secondary winding. A first terminal of the primary winding is connected to the second switching node, and a capacitor and an inductance (which is implemented with an inductor and/or the dispersion inductance of the transformer) are connected in series between a second terminal of the primary winding and the first switching node.

In various embodiments, a fifth electronic switch and a sixth electronic switch are connected between the positive output terminal and the negative output terminal, where a first terminal of the secondary winding is connected to the intermediate node between the fifth and sixth electronic switches.

In various embodiments, a second terminal of the secondary winding is connected to the first terminal of the primary winding.

Alternatively, the electronic converter may comprise a seventh electronic switch and an eighth electronic switch connected between the positive output terminal and the negative output terminal, where the second terminal of the secondary winding is connected to the intermediate node between the seventh and eighth electronic switches.

In various embodiments, the electronic converter comprises a control circuit configured for generating respective driving signals for the first, second, third, and fourth electronic switches in such a way as to repeat the following switching steps during a switching cycle:

during a first switching step, closing the first and third electronic switches and opening the second and fourth electronic switches; and during a second switching step, opening the first and third electronic switches and closing the second and fourth electronic switches.

For instance, the first, second, third, and fourth electronic switches may be implemented with FETs, for example MOSFETs.

The fifth and sixth electronic switches and possibly the seventh and eighth electronic switches may be implemented with electronic switches with control terminal, such as FETs, for example MOSFETs, or may comprise a diode or be obtained with a diode.

In particular, using electronic switches with control terminal, the control circuit can also generate respective driving signals for the fifth and sixth electronic switches in such a way as to:

open the fifth electronic switch and close the sixth electronic switch, during the first switching step; and close the fifth electronic switch and open the sixth electronic switch, during the second switching step.

Instead, when the fifth and sixth electronic switches comprise a respective diode, these diodes may be configured in such a way that:

the diode of the fifth electronic switch is open and the diode of the sixth electronic switch is closed, during the first switching step; and the diode of the fifth electronic switch is closed and the diode of the sixth electronic switch is open, during the second switching step.

Likewise, when the electronic converter comprises the seventh and eighth electronic switches in the form of electronic switches with control terminal, the control circuit can also generate respective driving signals for the seventh and eighth electronic switches, in such a way as to:

close the seventh electronic switch and open the eighth electronic switch, during the first switching step; and open the seventh electronic switch and close the eighth electronic switch, during the second switching step.

Instead, when the seventh and eighth electronic switches comprise a respective diode, these diodes may be configured in such a way that:

the diode of the seventh electronic switch is closed and the diode of the eighth electronic switch is open, during the first switching step; and the diode of the seventh electronic switch is open and the diode of the eighth electronic switch is closed, during the second switching step.

In various embodiments, the first switching step and the second switching step have the same duration.

In various embodiments, the capacitor and the inductance define a resonant circuit with a resonance period. In this case, the duration of the first switching step may be between 0.7 and 1.3 times the resonance half-period, preferably between 0.9 and 1.1 time the resonance half-period, preferably one resonance half-period.

In various embodiments, the electronic converter comprises a further positive output terminal for supplying a further output voltage. In this case, the transformer can have a center-tapped secondary winding comprising a first secondary winding and a second secondary winding, where the intermediate node between the first secondary winding and the second secondary winding is connected to the further positive output terminal.

In various embodiments, the electronic converter further comprises a ninth electronic switch connected between the second electronic switch and the positive output terminal, where the ninth electronic switch is configured for connecting the second electronic switch:

to the positive output terminal; or
to the negative input terminal; or
optionally to the further positive output terminal.

In various embodiments, the electronic converter comprises a tenth electronic switch connected between the first terminal of the primary winding and the second switching node, where the tenth electronic switch is configured for connecting the first terminal of the primary winding:

to the second switching node; or
to a reference voltage.

BRIEF DESCRIPTION OF THE DRAWINGS

The embodiments of the present disclosure will now be described with reference to the annexed drawings, which are provided purely to way of non-limiting example and in which.

DETAILED DESCRIPTION OF ILLUSTRATIVE EMBODIMENTS

In the ensuing description various specific details are illustrated aimed at providing an in-depth understanding of the embodiments. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in various points of this description do not necessarily refer to one and the same embodiment. Moreover, particular conformations, structures, or characteristics may be combined in any adequate way in one or more embodiments.

The references used herein are provided merely for convenience and hence do not define the sphere of protection or the scope of the embodiments.

In the ensuing FIGS. 2 to 8, parts, elements, or components that have already been described with reference to FIG. 1 are designated by the same references used previously in this figure; the description of these elements presented previously will not be repeated in order not to burden the present detailed description.

Figure 2:
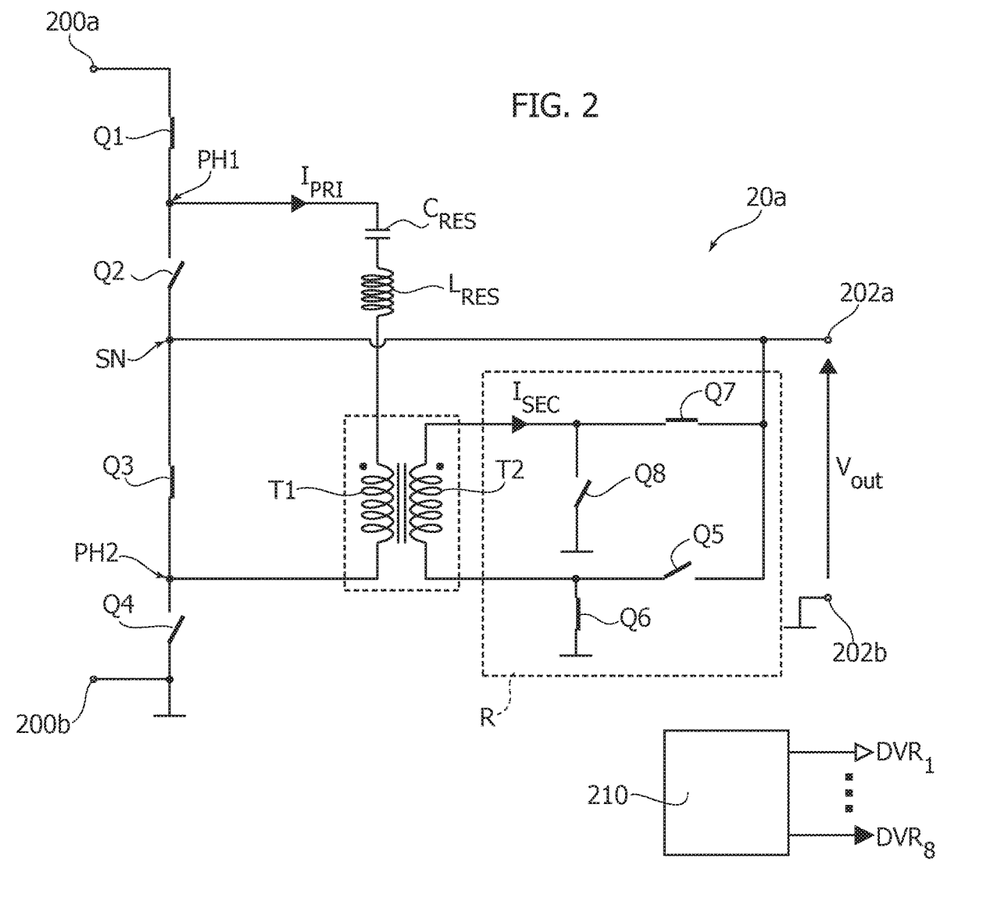
FIG. 2 shows a first embodiment of an electronic converter according to the present description.

FIG. 2 shows a first embodiment of an electronic converter 20a according to the present disclosure. Also in this case, the electronic converter 20a comprises:
two input terminals 200a and 200b configured for receiving a DC input voltage $V_{in}$; and
two output terminals 202a and 202b configured for supplying a DC output voltage $V_{out}$;

In the embodiment considered, the negative output terminal 202b is connected (for example, directly) to the negative input terminal 200b, which represents a reference voltage, for example, ground GND.

In the embodiment considered, four electronic switches Q1, Q2, Q3, and Q4 are connected (for example, directly) in series between the input terminals 200a and 200b. For instance, in various embodiments, the switches Q1, Q2, Q3, and Q4 are FETs, preferably n-channel FETs, for example MOSFETs. Consequently, in the embodiment considered, a first terminal of the switch Q1 is connected (for example, directly) to the terminal 200a, and the second terminal of the switch Q1 is connected (for example, directly) to a first terminal of the switch Q2, which thus represents a first switching node PH1. The second terminal of the switch Q2 is connected (for example, directly) to a first terminal of the switch Q3, which thus represents a second switching node SN. The second terminal of the switch Q3 is connected (for example, directly) to a first terminal of the switch Q4, which thus represents a third switching node PH2. Finally, the second terminal of the switch Q4 is connected (for example, directly) to the terminal 200b.

In the embodiment considered, the node SN is connected (for example, directly) to the output terminal 202a.

In the embodiment considered, the electronic converter 20a further comprises:
a capacitor $C_{RES}$;
an inductor $L_{RES}$; and
a transformer T, comprising a primary winding T1 and a secondary winding T2 with a given turn ratio N:1.

In particular, in the embodiment considered, the capacitor $C_{RES}$, the inductor $L_{RES}$, and the primary winding T1 of the transformer T are connected (for example, directly) in series between the nodes PH1 (node intermediate between the switches Q1 and Q2) and PH2 (node intermediate between the switches Q3 and Q4). For instance, in the embodiment considered, a first terminal of the capacitor $C_{RES}$ is connected (for example, directly) to the node PH1, the second terminal of the capacitor $C_{RES}$ is connected (for example, directly) to a first terminal of the inductor $L_{RES}$, and the second terminal of the inductor $L_{RES}$ is connected (for example, directly), through the primary winding T1, to the node PH2. In general, in the embodiment considered, the positions of the capacitor $C_{RES}$ and of the inductor $L_{RES}$ may also be reversed.

For instance, the capacitance of the capacitor $C_{RES}$ may be between 1 μF and 300 μF, and/or the inductance of the inductor $L_{RES}$ may be between 10 nH and 1 μH.

In the embodiment considered, the secondary winding T2 is connected by means of a rectifier circuit R to the output terminals 202a and 200b.

In particular, in the embodiment considered, the rectifier circuit comprises four electronic switches Q5, Q6, Q7, and Q8, where:
the switches Q5 and Q6 are connected (for example, directly) between the terminals 202a and 202b, where a first terminal of the secondary winding T2 of the transformer T is connected to the intermediate point between the switches Q5 and Q6; and
the switches Q7 and Q8 are connected (for example, directly) between the terminals 202a and 202b, where a second terminal of the secondary winding T2 of the transformer T is connected to the intermediate point between the switches Q7 and Q8.

Consequently, the electronic switches Q5, Q6, Q7, and Q8 are configured for reversing the connection of the secondary winding T2 to the output terminals 202a and 202b.

For instance, in various embodiments, the switches Q1, Q2, Q3, and Q4 are FETs, preferably n-channel FETs, for example MOSFETs. In various embodiments, the electronic switches Q5, Q6, Q7, and Q8 may also comprise or consist of diodes in such a way as to implement a diode-bridge rectifier R.

In various embodiments, a further capacitor may be connected also between the terminals 202a and 202b in order to filter the output voltage $V_{out}$.

In the embodiment considered, the electronic converter 20a further comprises a control circuit 210, such as an analog circuit and/or a digital circuit, for example, a microprocessor programmed via software code, configured for generating respective driving signals DRV1, . . . , DRV4 for the switches Q1, . . . , Q4, and possibly the driving signals DRV5, . . . , DRV8 for the switches Q5, . . . , Q8.

For instance, as will be described in greater detail hereinafter, the control circuit 210 is configured for generating the driving signals DRV1, . . . , DRV4 for the switches Q1, . . . , Q4, and possibly the driving signals DRV5, . . . , DRV8 for the switches Q5, . . . , Q8 in such a way that the following two operating intervals are repeated periodically:
during a first interval A, the switches Q1, Q3, Q6, and Q7 are closed and the switches Q2, Q4, Q5, and Q8 are open (see FIG. 3A); and
during a second interval B, the switches Q2, Q4, Q5, and Q8 are closed and the switches Q1, Q3, Q6, and Q7 are open (see FIG. 3B).

Figure 4:
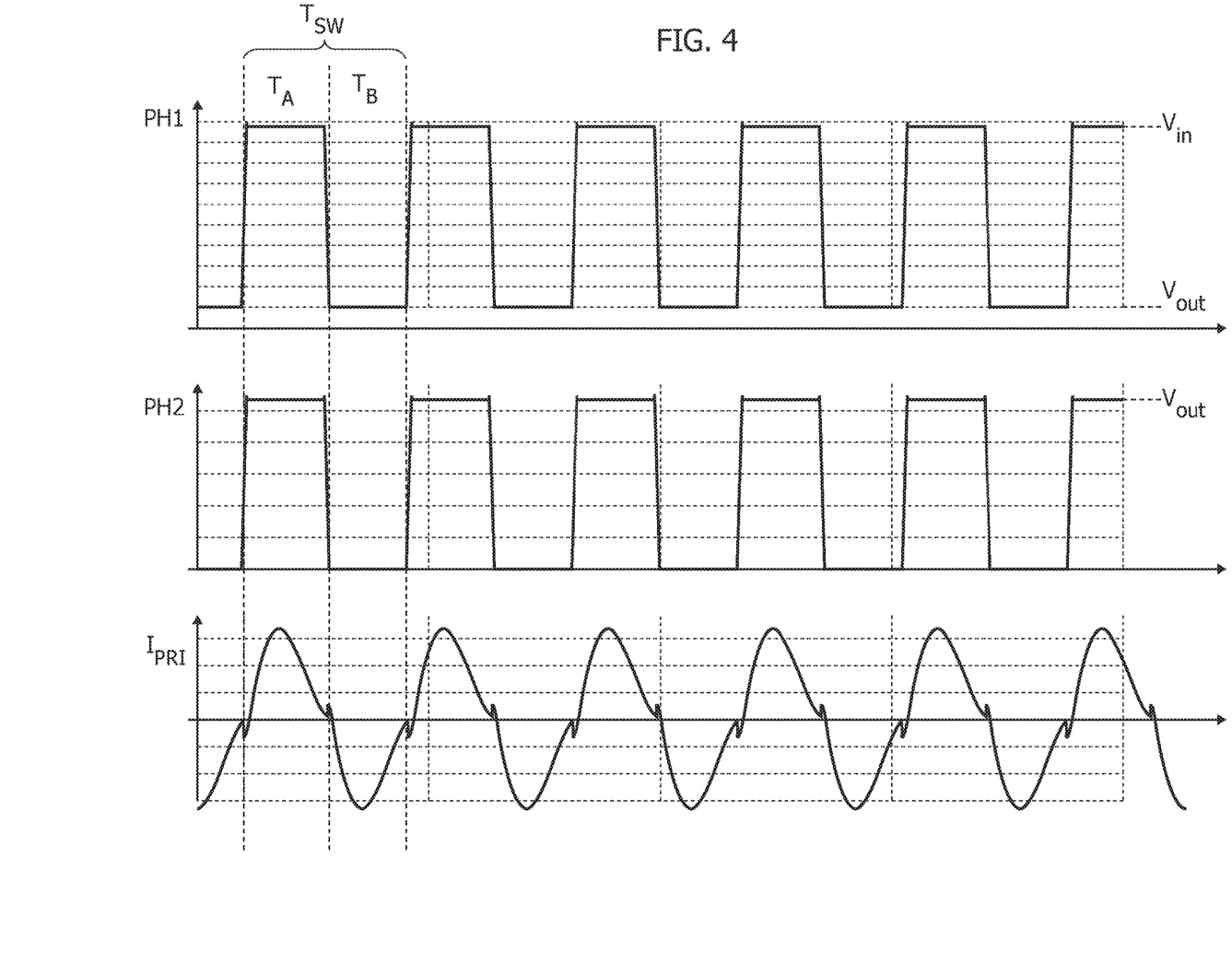
FIG. 4 shows various waveforms of the electronic converter of FIG. 2.

Consequently, as illustrated in FIG. 4, during the first interval A having a duration $T_A$, the node PH1 is connected to the terminal 200a/voltage $V_{in}$ and, during the second interval B having a duration $T_B$, the node PH1 is connected to the terminal 202a/voltage $V_{out}$. Instead, during the first interval A with duration $T_A$, the node PH2 is connected to the terminal 202a/voltage $V_{out}$ and, during the second interval B with duration $T_B$, the node PH2 is connected to the terminal 202b/reference voltage (ground).

Figure 3A:
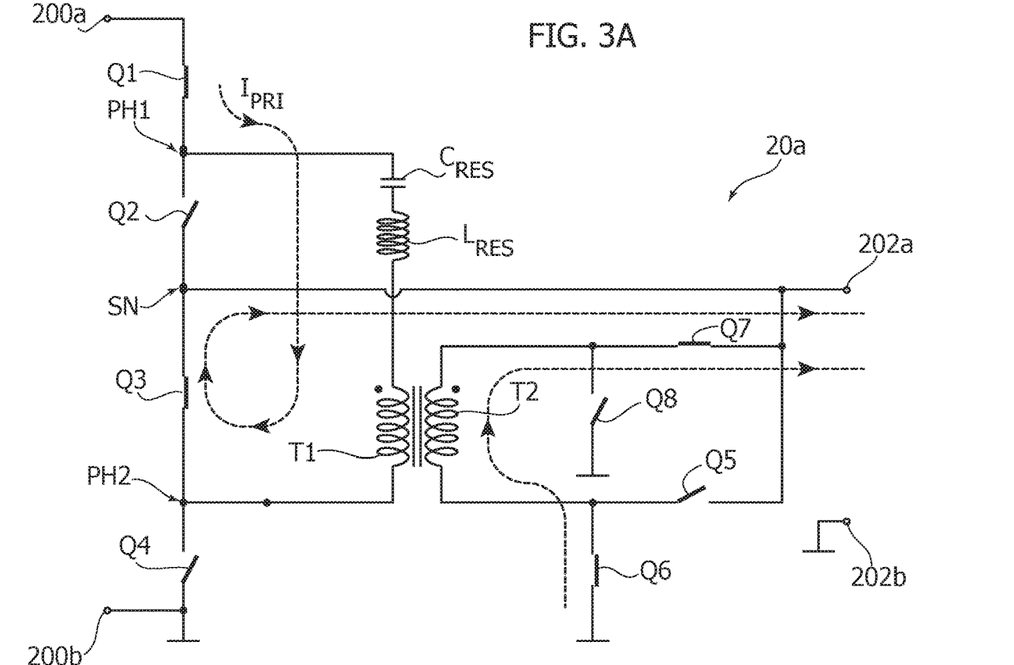
FIGS. 3A and 3B show two switching states of the electronic converter of FIG. 2.

In particular, as illustrated in FIG. 3A and considering also the fact that the output voltage $V_{out}$ is lower than the input voltage $V_{in}$ ($V_{out}<V_{in}$), during step A the current $I_{PRI}$ that traverses the primary winding T1 flows from the terminal 200a (voltage $V_{in}$), through the switch Q1, the network $L_{RES}/C_{RES}$, the primary winding T1 of the transformer T, the switch Q3, and finally to the output terminal 202a. Instead, the current $I_{SEC}$ that traverses the secondary winding T2 of the transformer T (which by definition is equal to the current of the primary divided by N) flows from the terminal 202b (ground), through the switch Q6, the secondary winding T2, and the switch Q7, to the terminal 202a.

In particular, by appropriately sizing the components, the (positive) current $I_{PRI}$ will comprise an oscillation with a resonant period $T_{RES}$:

$$T_{RES}=2\pi\cdot\sqrt{L_{RES}\cdot C_{RES}} \quad (1)$$

In various embodiments, the duration $T_A$ is chosen so that it substantially corresponds to a half-period of the aforesaid oscillation, for example, 0.7 $(T_{RES}/2)<T_A<1.3$ $(T_{RES}/2)$, preferably 0.9 $(T_{RES}/2)<T_A<1.1$ $(T_{RES}/2)$.

During this step A, the capacitance $C_{RES}$ is hence on average charged to a voltage $V_{CRES,A}$:

$$V_{CRES,A}=V_{in}-(N+1)\cdot V_{out} \quad (2)$$

Figure 3B:
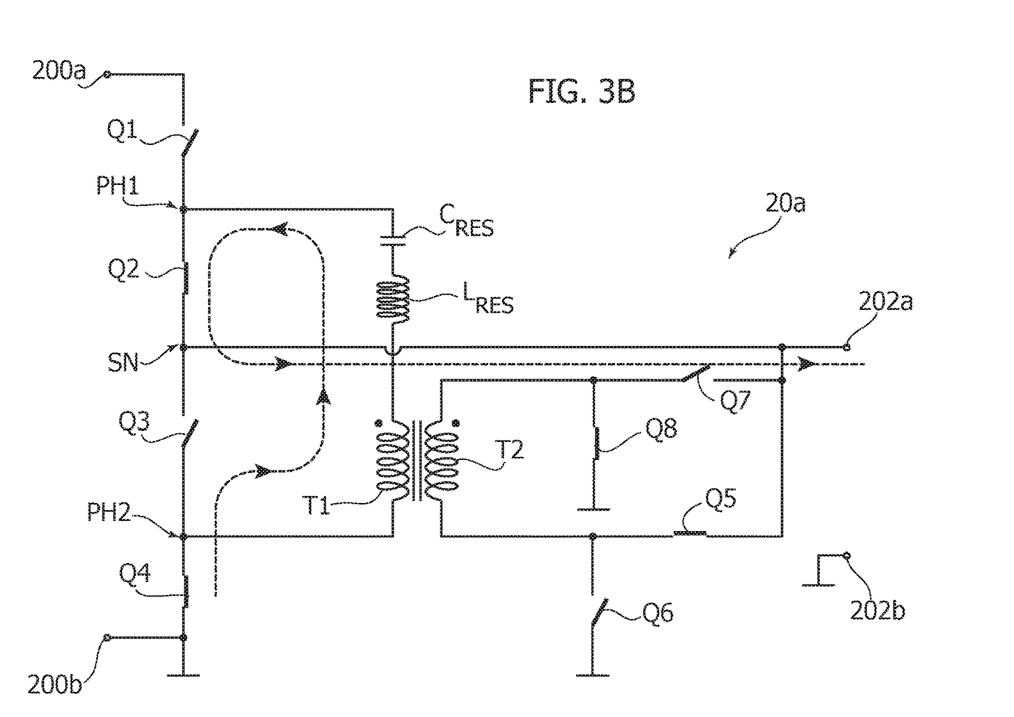

Instead, as illustrated in FIG. 3B, during step B, the current $I_{PRI}$ that traverses the primary winding T1 flows from the terminal 200b (reference voltage, for example, ground), through the switch Q4, the primary winding T1 of the transformer T, the network $L_{RES}/C_{RES}$, the switch Q2, and finally to the output terminal 202a. Instead, the current $I_{SEC}$ that traverses the secondary winding T2 of the transformer T (which by definition is equal to the current of the primary divided by N) flows from the terminal 202b (ground), through the switch Q8, the secondary winding T2, and the switch Q5, to the terminal 202a.

During this step B, the capacitance $C_{RES}$ is hence on average charged to a voltage $V_{CRES,B}$:

$$V_{CRES,B}=(N+1)\cdot V_{out} \quad (3)$$

Consequently, also in this case, the (negative) current $I_{PRI}$ will comprise an oscillation with the resonant period $T_{RES}$. In various embodiments, the duration $T_B$ is chosen so that it substantially corresponds to one half-period of the aforesaid oscillation, for example 0.7 $(T_{RES}/2)<T_B<1.3$ $(T_{RES}/2)$, preferably 0.9 $(T_{RES}/2)<T_B<1.1$ $(T_{RES}/2)$.

In various embodiments, the duration $T_A$ corresponds to the duration $T_B$, i.e., $T_A=T_B$. Consequently, in various embodiments, the control circuit 210 can generate two driving signals:
- a first driving signal for driving the switches Q1, Q3 (and possibly Q6 and Q7), where this signal has a constant frequency f determined according to the period $T_{RES}$ and a working cycle of 50%; and
- a second driving signal for driving the switches Q2, Q4 (and possibly Q5 and Q8), which corresponds to the first driving signal inverted.

Consequently, in the simplest case, the first driving signal may correspond to a clock signal supplied by an oscillator, such as a voltage-controlled oscillator (VCO), and the second driving signal may be obtained by supplying the first driving signal to an analog inverter.

In various embodiments, the electronic converter is hence non-regulated and works with a constant switching period $T_{SW}=T_A+T_B$.

In particular, when the durations $T_A$ and $T_B$ correspond to $T_{RES}/2$, the switches Q1, ..., Q4 switch with zero-current switching (ZCS).

In general, the switching period $T_{SW}$ may comprise also a first (brief) interval $T_{D1}$ between the intervals $T_A$ and $T_B$, and a second (brief) interval $T_{D2}$ between the intervals $T_B$ and $T_A$; i.e., $T_{SW}=T_A+T_B+T_{D1}+T_{D2}$. These intervals (which like the intervals $T_A$ and $T_B$ may be constant) may be useful for achieving a ZVS switching condition of the switches Q1, ..., Q4. In particular, in this case, the duration $T_A$ should be chosen in such a way that the current $I_{PRI}$ is positive at the end of the interval A and the duration $T_B$ should be chosen in such a way that the current $I_{PRI}$ is negative at the end of the interval B. For instance, in various embodiments, the durations $T_A$ and $T_B$ are slightly shorter than the resonance half-period; for example, $T_A$ (and likewise $T_B$) may be between 0.7 and 0.99 of $T_{RES}/2$.

In general, the transformer T may be modelled as an ideal transformer, a dispersion inductance (typically connected in series to the primary winding T1), and a magnetisation inductance (typically connected in parallel with the primary winding T1). Consequently, in various embodiments, the inductor $L_{RES}$ may also be implemented with the dispersion inductance of the transformer T, or the inductance $L_{RES}$ may correspond to the sum of the inductance of an inductor (connected in series with the primary winding T1) and the dispersion inductance of the transformer T.

Through the law of charge balancing on the capacitor $C_{RES}$ in steps A and B, it is hence possible to write the conversion ratio $N_{CONV}$ of the electronic converter as follows:

$$N_{CONV}=V_{in}/V_{out}=2N+2 \quad (4)$$

i.e., the conversion ratio $N_{CONV}$ is mainly determined by the turn ratio N:1 of the transformer T. In particular, as may be noted from Eq. (4), the conversion ratio $N_{CONV}$ presents an additional coefficient equal to 2; this means that the transformer T can be sized with a transformation ratio decreased by 1.

For instance, for an LLC electronic converter, the conversion ratio $N_{CONV}$ corresponds to 2 N. Consequently, assuming a number of turns on the secondary equal to 4, such an LLC converter would require 8 turns on the primary to achieve a conversion ratio $N_{CONV}$ of 4:1. Instead, with the solution proposed, the same conversion ratio $N_{CONV}$ can be obtained with a number of turns on the primary reduced to 4.

As mentioned previously, one or more of the switches Q1, ..., Q8 may be FETs, such as MOSFETs.

Figure 5:
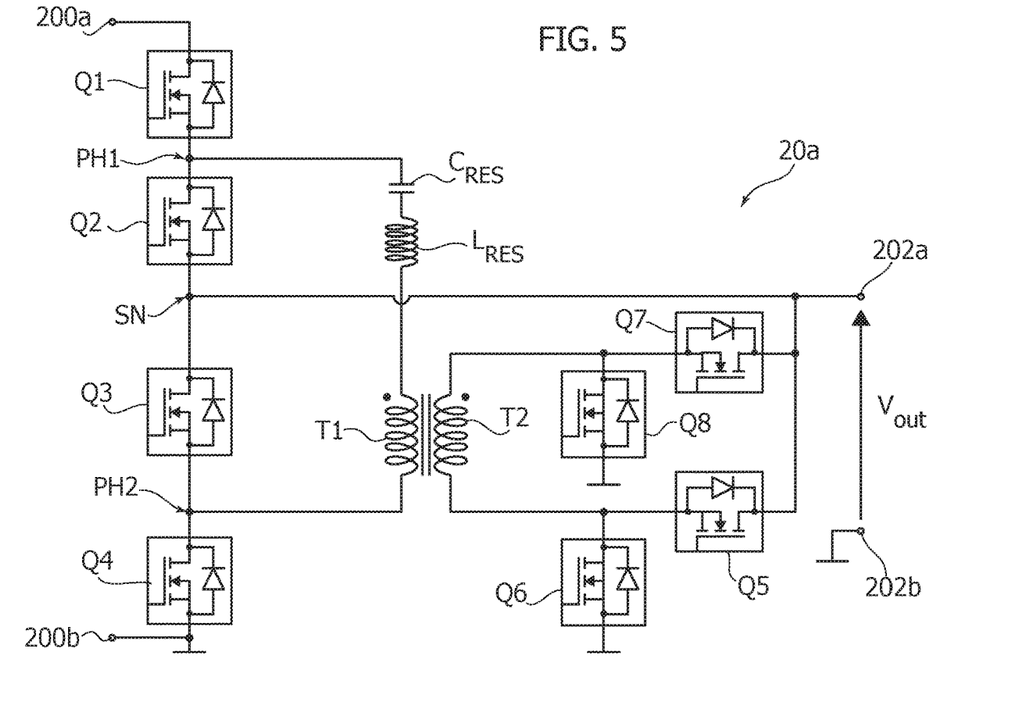
FIG. 5 shows an example of embodiment of the electronic converter of FIG. 2.

For instance, FIG. 5 shows an embodiment in which the switches Q1, ..., Q4 are n-channel FETs, such as MOSFETs. In this case, a drain terminal of the transistor Q1 is connected to the terminal 200a, a source terminal of the transistor Q1 is connected to a drain terminal of the transistor Q2, a source terminal of the transistor Q2 is connected to a drain terminal of the transistor Q3, a source terminal of the transistor Q3 is connected to a drain terminal of the transistor Q4, and a source terminal of the transistor Q4 is connected to the terminal 200b.

In the embodiment considered, also the rectifier circuit R is implemented with four n-channel FETs. In this case, a drain terminal of the transistor Q7 is connected to the terminal 202a, a source terminal of the transistor Q7 is connected to a drain terminal of the transistor Q8, and a source terminal of the transistor Q8 is connected to the terminal 202b. Likewise, a drain terminal of the transistor Q5 is connected to the terminal 202a, a source terminal of the transistor Q5 is connected to a drain terminal of the transistor Q6, and a source terminal of the transistor Q6 is connected to the terminal 202b.

FIG. 5 shows also the fact that the switches Q5, ..., Q7 may comprise or consist of diodes. For instance, FIG. 5 also shows the body diodes of the transistors Q1, ..., Q8, and these body diodes (with their cathode connected to the drain terminal and their anode connected to the source terminal) of the transistors Q5, ..., Q8 implement a diode-bridge rectifier. In any case, using transistors for these switches, the electrical losses caused by these switches can be reduced.

Figure 6:
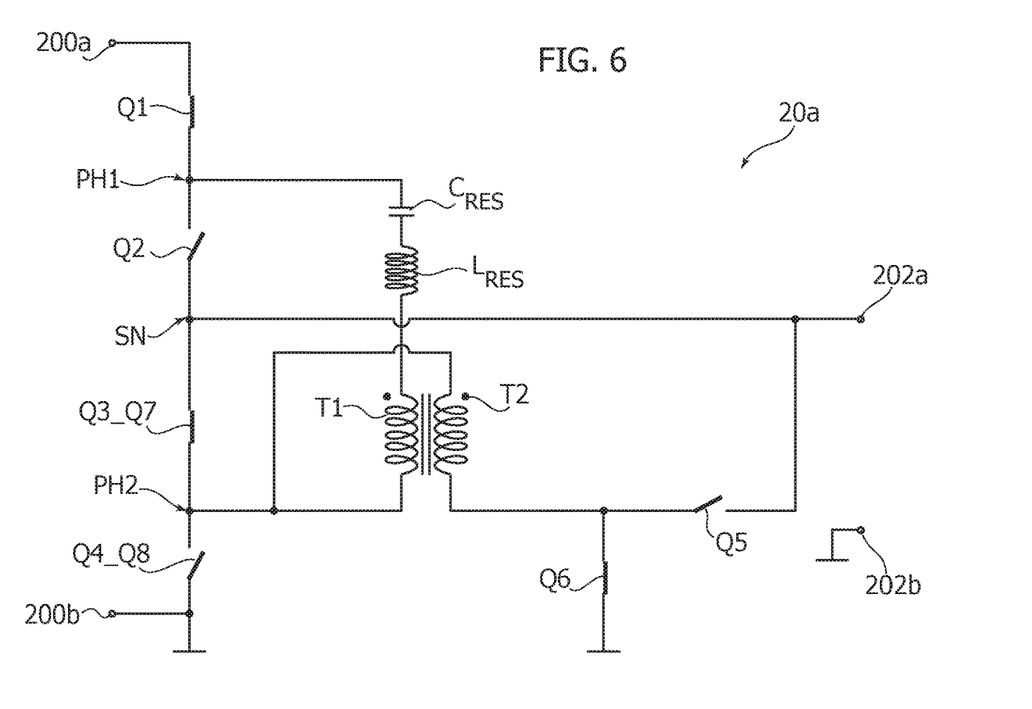
FIG. 6 shows a second embodiment of an electronic converter according to the present description.

FIG. 6 shows a second embodiment of an electronic converter 20a. In particular, as described previously, the switches Q3/Q4 and also the switches Q7/Q8, are both connected between the terminals 202a and 202b and are driven in a synchronous way. It is thus possible to join the switching nodes of these two half-bridges and use just one half-bridge.

Consequently, in the embodiment considered, the switches Q7/Q8 have been removed as compared to what is illustrated in FIG. 2. Hence, a terminal of the secondary winding T2 remains connected to the intermediate point between the switches Q5 and Q6. Instead, the second terminal of the secondary winding T2 is no longer connected to the switches Q7/Q8, but is now connected to the intermediate point between the switches Q3 (which is now denoted by the reference Q3_Q7) and Q4 (which is now denoted by the reference Q4_Q8), i.e., the node PH2.

The advantage of this structure is that the construction of the transformer T could benefit from a simplification. In fact, just three terminals are required, and in practice the resulting structure of the transformer T is that of an auto-transformer. However, the current circulating in the pair of switches Q3_Q7 and Q4_Q8 is now equal to $I_{PRI}+I_{SEC}$, i.e., $(N+1) \cdot I_{PRI}$, which should be taken into consideration during sizing of the switches.

Figure 7:
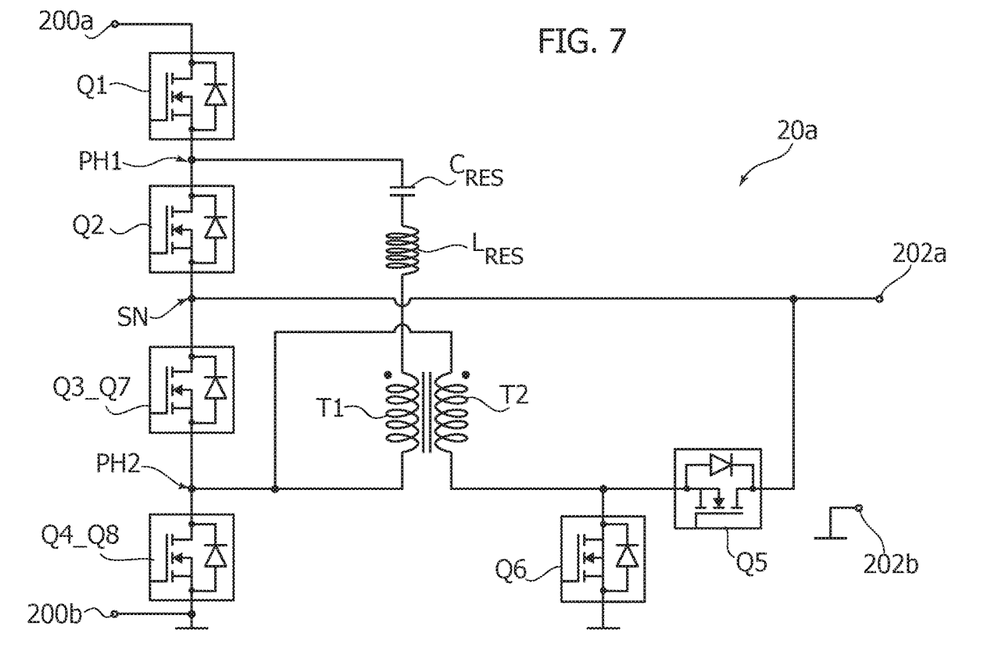
FIG. 7 shows an example of embodiment of the electronic converter of FIG. 6.

FIG. 7 shows a corresponding embodiment, in which the switches Q1, Q2, Q3_Q7, and Q4_Q8 and possibly also the switches Q5 and Q6 are n-channel FETs, for example, MOSFETs.

The inventor has noted that the structure proposed may also be generalised to obtain different gains using one and the same transformer T. In fact, this makes it possible to avoid sizing and customising of the transformer T for each type of converter. Using the same transformer T for different conversion ratios $N_{CONV}$ it is possible to have different conversion ratios by modifying just some connections of the topology presented.

Figure 8:
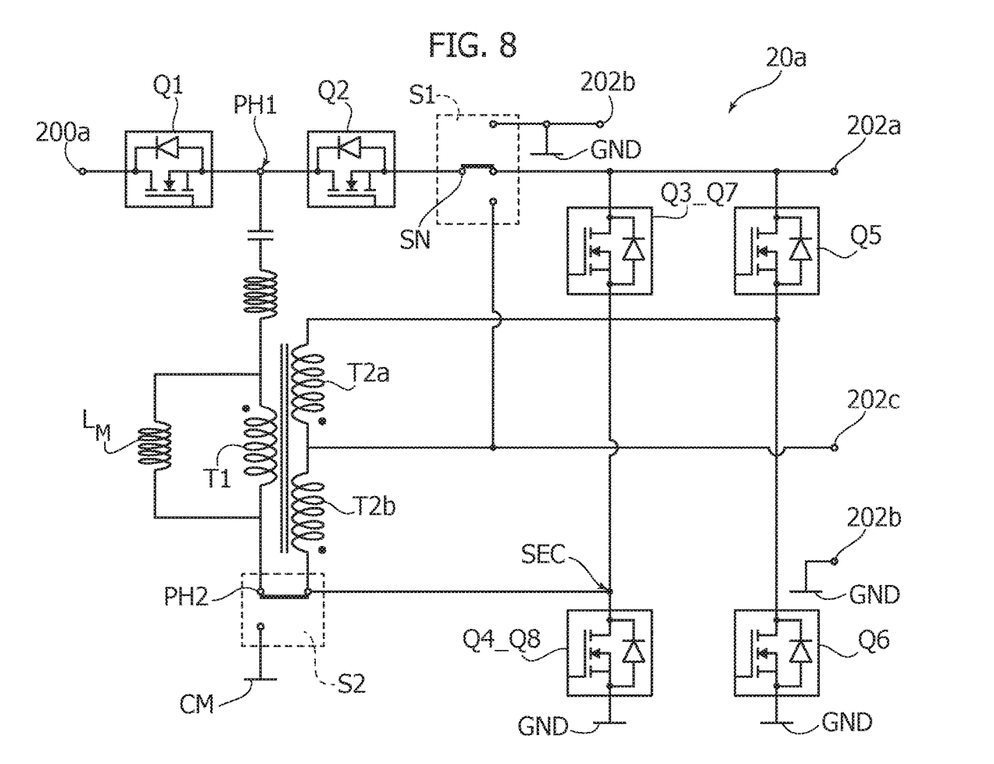
FIG. 8 shows a third embodiment of an electronic converter according to the present description.

In particular, as shown in FIG. 8, and as compared to FIG. 6, the following modifications have been made, which can also be used individually:

the transformer T is a center-tapped transformer, which thus comprises a first secondary winding T2a and a second secondary winding T2b connected in series;

a first switch S1 (ninth electronic switch) has been added, which makes it possible to set the voltage on the node SN at a first reference voltage, and consequently the voltage that is applied to the node PH1 ($V_{in}$ or the voltage on the node SN on the basis of switching of the switches Q1 and Q2); and a second switch S2 (tenth electronic switch) has been added, which makes it possible to connect the node PH2 to the intermediate point between the switches Q3/Q3_Q7 and Q4/Q4_Q8, or to a second reference voltage CM.

In general, the switches S1 and/or S2 may be implemented with:

one or more electronic switches, and/or a mechanical connection, for example by providing metal slots on a printed circuit and fixing (for example, soldering) a jumper, such as a 0-Ω resistor, between two metal slots.

Basically, the center-tapped transformer makes it possible to obtain on the intermediate node of the secondary winding T2 (between the windings T2a and T2b) an output voltage $V_{out2}$ that corresponds to one half of the output voltage $V_{out}$, i.e., $V_{out2}=V_{out}/2$.

In particular, the switches Q5 and Q6 are again connected between the terminals 202a and 202b, where the terminal 202b is connected to the terminal 200b that represents a reference voltage, for example, ground GND. Moreover, the switches Q3_Q7 and Q4_Q8 are again connected between the terminals 202a and 202b. In addition, the secondary winding T2 (which comprises the windings T2a and T2b) is connected between the intermediate point between the switches Q5/Q6 and the intermediate point between the switches Q3_Q7/Q4_Q8.

In the embodiment considered, the electronic converter comprises a further output terminal 202c, which is connected (for example, directly) to the intermediate node between the windings T2a and T2b. Consequently, the voltage $V_{out2}$ between the terminals 202c and 202b corresponds to one half of the voltage $V_{out}$ between the terminals 202a and 202b.

In the embodiment considered, the switches Q1 and Q2 are once again connected in series between the terminal 200a and the node SN. Moreover, the capacitor $C_{RES}$ and the inductor $L_{RES}$ are connected in series to the primary winding T1 between the node PH1 (intermediate node between the switches Q1 and Q2) and the node PH2.

As explained previously, the switch S1 makes it possible to set the voltage on the node SN to a reference voltage. For instance, in the embodiment considered, the switch S1 is configured for connecting the node SN:

to the terminal 202a (which corresponds to the embodiment illustrated in FIG. 6); or to the terminal 200b (ground); or optionally to the terminal 202c.

Instead, the switch S2 is configured for connecting the terminal of the primary winding T1/node PH2:

to the intermediate point (now designated by the reference SEC) between the switches Q3_Q7 and Q4_Q8 (which corresponds to the embodiment illustrated in FIG. 6), or to a second reference voltage CM.

In general, the reference voltage CM corresponds to a non-switching common-mode voltage, such as GND, $V_{out}$, or $V_{out2}$. Consequently, in various embodiments considered, the switch S1 is configured for enabling connection of the node PH2 to the node 200a, 200b, or 200c.

Hence, when the node SN is connected (e.g., via the switch S1) to the terminal 202a, and the node PH2 is connected (e.g., via the switch S2) to the intermediate point SEC between the switches Q3_Q7 and Q4_Q8, the converter 20a presents the configuration illustrated in FIG. 6. Instead, when the node SN is connected (e.g., via the switch S1) to the terminal 200b, and the node PH2 is connected (e.g., via the switch S2) to the voltage CM, for instance to the terminal 200b, the converter 20a presents the configuration of a traditional LLC converter, in which the secondary winding T2 may even be isolated from the primary winding T1.

However, other configurations with different conversion ratios $N_{CONV}$ may also be implemented. In particular, it is possible to define two conversion-ratio tables $V_{in}/V_{out}$ and $V_{in}/V_{out2}$ according to the connection of the switches S1 and S2:

| | $V_{in}/V_{out}$ | | |
|---|---|---|---|
| S1 | 202a ($V_{out}$) | 202c ($V_{out2}$) | 202b (GND) |
| S2 = SEC | 2N + 2 | 2N + 1.5 | 2N + 1 |
| S2 = CM | 2N + 1 | 2N + 0.5 | 2N |

| $V_{in}/V_{out2}$ | | |
|---|---|---|
| 202a ($V_{out}$) | 202c ($V_{out2}$) | 202b (GND) |
| 4N + 4 | 4N + 3 | 4N + 2 |
| 4N + 2 | 4N + 1 | 4N |

Hence, the converter of FIG. 8 makes it possible to obtain the same conversion ratio using different transformation ratios (N) of the transformer. The optimal transformation ratio may be obtained as a function of the characteristics of the conversion. For instance, it may be useful to minimise the total number of windings in order to reduce the resistance of the windings themselves. Other considerations may be made, such as the maximum value of drain-to-source voltage $V_{DS}$ present on the MOSFETs. In this case, the transformation ratio may be sized to have a maximum value $V_{DS}$ within certain pre-set limits.

For instance, if the aim were to obtain a conversion ratio equal to 5 for the voltage $V_{out}$, the minimum transformation ratio N would be 1.5 if the configuration S1=$V_{out}$ and S2=SEC is adopted. Considering that the minimum number of turns on the secondary of the center-tapped transformer T is equal to 1+1, the primary winding T1 should have 3 turns. If, instead, the output $V_{OUT2}$ is used to have a conversion ratio equal to 5, once again considering a number of turns on the secondary equal to 1+1, the minimum transformation ratio N is 1 if the configuration S1=$V_{out2}$ and S2=CM is used. The second option is thus more interesting from the standpoint of the number of turns of the transformer but calls for transistors Q3_Q7, Q4_Q8, Q5, and Q6 with twice the voltage $BV_{DSS}$ (Drain-to-Source Breakdown Voltage) as compared to the first solution.

Of course, without prejudice to the principle of the invention, the details of construction and the embodiments may vary widely with respect to what has been described and illustrated herein purely by way of example, without thereby departing from the scope of the present invention, as defined in the ensuing claims.

What is claimed is:

1. An electronic converter comprising:
    a first node switchably coupled to a positive input terminal in a first switching state or to a first positive output terminal in a second switching state;
    a negative input terminal connected to a negative output terminal;
    a resonant circuit connected in series between the first node and a first terminal of a primary winding of a transformer;
    a second node connected to a second terminal of the primary winding, and switchably coupled to the first positive output terminal in the first switching state, or to the negative input terminal in the second switching state;
    a first terminal of a secondary winding of the transformer switchably coupled to the first positive output terminal in the first switching state, or to the negative input terminal in the second switching state; and
    a second terminal of the secondary winding switchably coupled to the negative input terminal in the first switching state, or to the first positive output terminal in the second switching state.

2. The electronic converter according to claim 1, wherein the resonant circuit comprises a capacitor and an inductor connected in series.

3. The electronic converter according to claim 1, further comprising a control circuit configured for switching the electronic converter between the first switching state and the second switching state.

4. The electronic converter according to claim 3, wherein the control circuit is connected to respective electronic switches to perform the switching.

5. The electronic converter according to claim 4, wherein the control circuit is configured for generating respective driving signals to control the respective electronic switches.

6. The electronic converter according to claim 5, wherein each of the respective electronic switches comprises a diode.

7. The electronic converter according to claim 3, wherein the control circuit is further configured for repeating the switching between the first and second switching states in a switching cycle.

8. The electronic converter according to claim 7, wherein the first switching state and the second switching state have a same duration in the switching cycle.

9. The electronic converter according to claim 8, wherein the resonant circuit has a resonance period, and wherein the duration is between 0.7 and 1.3 times a half-period of the resonance period.

10. The electronic converter according to claim 8, wherein the resonant circuit has a resonance period, and wherein the duration is between 0.9 and 1.1 times a half-period of the resonance period.

11. The electronic converter according to claim 8, wherein the resonant circuit has a resonance period, and wherein the duration is equal to one half-period of the resonance period.

12. The electronic converter according to claim 1, further comprising:
    a first electronic switch disposed between the first node and the positive input terminal;
    a second electronic switch disposed between the first node and the first positive output terminal;
    a third electronic switch disposed between the second node and the positive input terminal; and
    a fourth electronic switch disposed between the second node and the negative input terminal.

13. The electronic converter according to claim 12, further comprising:
    a fifth electronic switch disposed between the second terminal of the secondary winding and the first positive output terminal;
    a sixth electronic switch disposed between the second terminal of the secondary winding and the negative input terminal;
    a seventh electronic switch disposed between the first terminal of the secondary winding and the first positive output terminal; and
    an eighth electronic switch disposed between the first terminal of the secondary winding and the negative input terminal.

14. The electronic converter according to claim 13, wherein each of the respective electronic switches comprises a diode.

15. The electronic converter according to claim 13, further comprising a control circuit connected to the electronic switches, and configured to switch the electronic converter between the first switching state and the second switching state.

16. The electronic converter according to claim 15, wherein the first, third, sixth and seventh electronic switches are closed in the first switching state, and the second, fourth, fifth and eighth electronic switches are open in the first switching state.

17. The electronic converter according to claim 15, wherein the first, third, sixth and seventh electronic switches are open in the second switching state, and the second, fourth, fifth and eighth electronic switches are closed in the second switching state.

18. The electronic converter according to claim 13, wherein the secondary winding is a center-tapped secondary winding comprising a first secondary winding and a second secondary winding, and wherein the electronic converter comprises:
   a second positive output terminal; and
   an intermediate node between the first secondary winding and the second secondary winding connected to the second positive output terminal.

19. The electronic converter according to claim 18, wherein the second electronic switch is switchably coupled, in the first switching state, to the first positive output terminal or the second positive output terminal.

20. The electronic converter according to claim 19, further comprising:
   a ninth electronic switch coupled to the second electronic switch, and configured to switch, in the first switching state, between the first positive output terminal or the second positive output terminal.

21. The electronic converter according to claim 19, wherein the second terminal of the primary winding is switchably coupled, in the first switching state, to the second node or a reference voltage.

22. The electronic converter according to claim 21, further comprising:
   a tenth electronic switch coupled to the second terminal of the primary winding, and configured to switch, in the first switching state, between the second node or the reference voltage.

* * * * *